United States Patent
Hachuda

(10) Patent No.: US 9,755,387 B2
(45) Date of Patent: Sep. 5, 2017

(54) ELEVATING MECHANISM AND SOCKET FOR ELECTRICAL COMPONENT

(71) Applicant: ENPLAS CORPORATION, Kawaguchi-shi, Saitama (JP)

(72) Inventor: Osamu Hachuda, Kawaguchi (JP)

(73) Assignee: ENPLAS CORPORATION, Kawaguchi (JP)

( * ) Notice: Subject to any disclaimer, the term of this patent is extended or adjusted under 35 U.S.C. 154(b) by 0 days.

(21) Appl. No.: 15/300,610

(22) PCT Filed: Mar. 27, 2015

(86) PCT No.: PCT/JP2015/059573
§ 371 (c)(1),
(2) Date: Sep. 29, 2016

(87) PCT Pub. No.: WO2015/152033
PCT Pub. Date: Oct. 8, 2015

(65) Prior Publication Data
US 2017/0110841 A1    Apr. 20, 2017

(30) Foreign Application Priority Data
Mar. 31, 2014   (JP) .................. 2014-071608

(51) Int. Cl.
*H01R 33/76* (2006.01)
*H01R 13/629* (2006.01)

(52) U.S. Cl.
CPC ... *H01R 33/7664* (2013.01); *H01R 13/62977* (2013.01)

(58) Field of Classification Search
CPC .......................... G01R 1/0466; G01R 1/0483; G01R 31/2863; G01R 1/07357; G01R 1/0408;
(Continued)

(56) References Cited

U.S. PATENT DOCUMENTS

| 5,256,080 A | 10/1993 | Bright |
| 5,647,756 A * | 7/1997 | Twigg ................. G01R 1/0433 439/331 |

(Continued)

FOREIGN PATENT DOCUMENTS

| JP | 6-52954 | 2/1994 |
| JP | 2002-8809 | 1/2002 |

(Continued)

OTHER PUBLICATIONS

International Search report mailed Jun. 30, 2015, in corresponding International Application No. PCT/JP2015/059573.

*Primary Examiner* — Truc Nguyen
(74) *Attorney, Agent, or Firm* — Staas & Halsey LLP

(57) ABSTRACT

A socket for electrical component capable of pressing and fixing an electrical component.

A pressing part includes a first cam rotatably supported by the body part, and a second cam supported by the first cam. An elevating part includes a cam locking part provided on a rotational orbit of the second cam. A tip of the second cam is formed such that the tip of the second cam passes over the cam locking part when the elevating part is moved down by making the tip of the second cam abut against the elevating part and rotate, and the tip of the second cam is locked by the cam locking part so as to prevent the rotation when an attempt is made to perform the rotation in the opposite direction. The rotation in the opposite direction is enabled by moving the second cam in the radial direction of the rotation.

8 Claims, 11 Drawing Sheets

(58) Field of Classification Search
CPC ............ G01R 31/2851; G01R 31/2886; G01R 31/2887
See application file for complete search history.

(56) References Cited

U.S. PATENT DOCUMENTS

| | | | | |
|---|---|---|---|---|
| 5,718,595 | A * | 2/1998 | Tohyama | H05K 7/1023 439/330 |
| 6,086,387 | A * | 7/2000 | Gallagher | G01R 1/0483 439/331 |
| 6,137,298 | A * | 10/2000 | Binns | G01R 31/2886 324/750.02 |
| 7,914,313 | B1 * | 3/2011 | Ramsey | G01R 1/0466 439/330 |
| 2001/0055902 | A1 | 12/2001 | Hayakawa | |
| 2003/0100201 | A1 * | 5/2003 | Ikeya | G01R 1/0483 439/73 |
| 2004/0248435 | A1 * | 12/2004 | Sato | G01R 1/0466 439/73 |
| 2005/0014399 | A1 | 1/2005 | Azumi et al. | |
| 2005/0164530 | A1 * | 7/2005 | Yates | G01R 1/0466 439/73 |
| 2009/0275220 | A1 * | 11/2009 | Hwang | G01R 1/0466 439/73 |
| 2010/0062622 | A1 * | 3/2010 | Chen | H05K 7/1007 439/72 |
| 2010/0159731 | A1 * | 6/2010 | Kunioka | H01R 13/2421 439/331 |

FOREIGN PATENT DOCUMENTS

| | | |
|---|---|---|
| JP | 2005-37156 | 2/2005 |
| JP | 2006-252946 | 9/2006 |

* cited by examiner

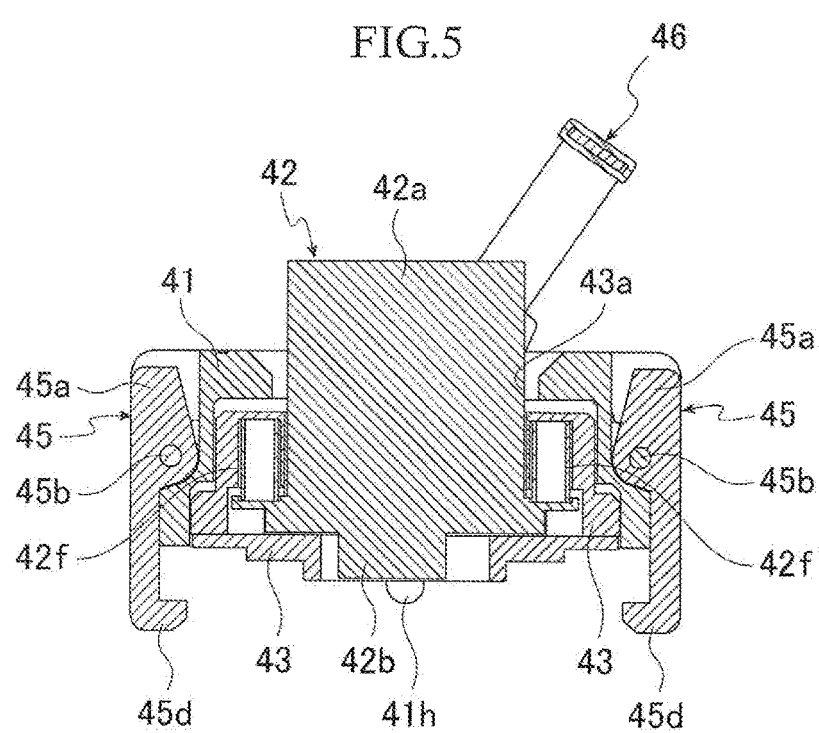

ELEVATING MECHANISM AND SOCKET FOR ELECTRICAL COMPONENT

CROSS REFERENCE TO THE RELATED APPLICATION

This application is a U.S. national stage application, which claims the benefit under 35 USC §371 of PCT International Patent Application No. PCT/JP2015/059573 filed Mar. 27, 2015 which claims foreign priority benefit under 35 USC §119 of Japanese patent application No. 2014-071608, filed Mar. 31, 2014, the contents of which are herein incorporated by reference.

TECHNICAL FIELD

The present invention relates to an elevating mechanism capable of moving an elevating part up and down with respect to a body part, and to a socket for electrical component housing an electrical component such as a semiconductor device (hereinafter referred to as an "IC package").

BACKGROUND ART

Conventionally, as a "socket for electrical component", a socket is known that houses an electrical component such as a semiconductor device (hereinafter referred to as an "IC package"). As this type of socket for electrical component, there is an IC socket in which a socket body and a cover unit are completely separated, as described in, for example, Japanese Patent Laid-Open No. 2006-252946.

In the IC socket of Japanese Patent Laid-Open No. 2006-252946, as shown in FIG. 5 thereof, an IC package is housed in the socket body, and a push-fit cover unit is set to an upper surface thereof.

Further, a claw of a latch provided to this push-fit cover unit is engaged with the socket body. On this occasion, this latch is biased in the closing direction by a coil spring, such that this push-fit cover unit is held by the socket body.

Then, a push-fit member provided to this push-fit cover unit is made to abut against the upper surface of the IC package, and an adjusting knob provided in a middle portion of this push-fit cover unit is rotated in a horizontal direction so as to press this push-fit member, thereby fixing this IC package.

In this manner, it is possible to fix this IC package with an appropriate pressing force.

SUMMARY OF INVENTION

Technical Problem

However, such a conventional socket is configured to press the push-fit member on the IC package from above and to fix the IC package by rotating the adjusting knob provided in the middle portion of the push-fit cover unit many times in the direction perpendicular to a push-fit direction. Therefore, the operability is poor.

Accordingly, the object of the present invention is to provide an elevating mechanism capable of performing pressing with a simple operation, and a socket for electrical component using this elevating mechanism.

Solution to Problem

In order to achieve the object, an elevating mechanism in accordance with the present invention includes an elevating part supported by a body part such that the elevating part can be moved up and down, and a pressing part supported by the body part and moving down the elevating part, in which the pressing part includes a first cam rotatably supported by the body part, and a second cam supported by the first cam and capable of being rotated and moved in a radial direction of the rotation, the elevating part includes a cam locking part provided on a rotational orbit of the second cam, a shape of a tip of the second cam is formed such that the tip of the second cam passes over the cam locking part when the elevating part is moved down by making the tip of the second cam abut against the elevating part and rotate, and the tip of the second cam is locked by the cam locking part so as to prevent the rotation when an attempt is made to perform the rotation in the opposite direction, and the rotation in the opposite direction is enabled by moving the second cam in the radial direction of the rotation with respect to the first cam, so as to release a locked state between the second cam and the cam locking part.

In the present invention, desirably, a first cam surface and a second cam surface, which are angled to each other, are formed in a tip of the first cam, in a state where the elevating part is moved up, an upper surface of the elevating part abuts against the first cam surface, and the elevating part is moved down by rotating the first cam such that the second cam surface abuts against the upper surface of the elevating part.

In the present invention, desirably, the pressing parts are provided in each of a pair of opposing sides of the body part, and the second cams of these pressing parts are connected to each other with a horizontal bar portion.

In the present invention, desirably, the second cam includes a first elongated hole and a second elongated hole provided along the radial direction of the rotation, the first cam is provided with protruding portions inserted in the respective first and second elongated holes, the number of the protruding portions being the same as the number of the elongated holes, and the second cam is biased in a direction approaching to the elevating part by providing a biasing member between an end portion of any of the elongated holes and the protruding portion inserted in the elongated hole.

In the present invention, desirably, in the tip of the second cam, a lock portion having a steep angle and a gentle-angled portion having a gentle angle are continuously formed via a curved surface, and when the elevating part is moved down, the gentle-angled portion climbs over the cam locking part and moves on a pressed surface of the elevating part without being locked by the cam locking part, and when an attempt is made to rotate the second cam in the opposite direction after the gentle-angled portion climbed over the cam locking part, the lock portion is locked by the cam locking part to prevent the rotation.

In the present invention, desirably, the tip of the first cam includes a groove formed along a rotating direction of the first cam, and the first cam is rotated such that the cam locking part passes through inside the groove.

In the present invention, desirably, the first cam includes an insertion slit, the second cam is inserted into the insertion slit, and the tip of the second cam is exposed from the insertion slit.

A socket for electrical component in accordance with the present invention includes a socket body in which an electrical component is housed in a housing portion provided in an upper surface side, and a contact pin to be electrically connected to the electrical component is provided, and includes a cover member removably provided to the socket body and covering the housing portion of the socket body, in which the cover member includes a cover body placed on the socket body, and the elevating mechanism according to any one of claims 1 to 4 is provided to the cover body.

Advantageous Effects of Invention

According to the elevating mechanism in accordance with the present invention, it is possible to prevent the rotation in the opposite direction by engaging the second cam with the cam locking part, and it is possible to release the locked state by moving the second cam in the radial direction. Accordingly, it is possible to easily switch the elevating part between the moved-up state and the moved-down state.

In the present invention, by moving down the elevating part by rotating the first cams and the second cams, the operation of the elevating part becomes easy.

In the present invention, by moving down the elevating part by operating the horizontal bar portion of the elevating part, the operation of the elevating part becomes easier.

In the present invention, it is possible to realize, with a simple configuration, a mechanism for releasing the locked state by moving the second cam away from the elevating part.

In the present invention, by employing the configuration where, while the gentle-angled portion is not locked by the cam locking part when the gentle-angled portion is moved on the pressed surface of the elevating part, the lock portion is locked by the cam locking part when the lock portion is moved on the pressed surface, it is possible to inhibit, with a simple configuration, the rotation in the opposite direction, while allowing the rotation of the second cam in a direction that the elevating part is moved down.

In the present invention, a groove is provided in the tip of the first cam, and the first cam is rotated such that the cam locking part passes through the groove, it is possible to stabilize the rotation operation of the first cam.

In the present invention, by providing an insertion slit to the first cam and inserting therein the second cam, and exposing the tip of the second cam from the insertion slit, it is possible, with a simple configuration, to rotate the second cam and to move the second cam in the radial direction of the rotation while supporting the second cam by the first cam.

According to the socket for electrical component in accordance with the present invention, because the elevating mechanism in accordance with the present invention is used, it is possible to provide a socket for electrical component capable of performing pressing without providing, in the middle portion, a knob rotating in the direction perpendicular to the pressing direction.

BRIEF DESCRIPTION OF DRAWINGS

FIG. 5 is a cross-sectional view showing the configuration of the cover member of the socket for electrical component in accordance with the embodiment 1.

DESCRIPTION OF EMBODIMENTS

Embodiment 1 of the Present Invention

Hereinbelow, a description is given of an embodiment 1 of the present invention with reference to FIGS. 1 to 7.

Figure 1:
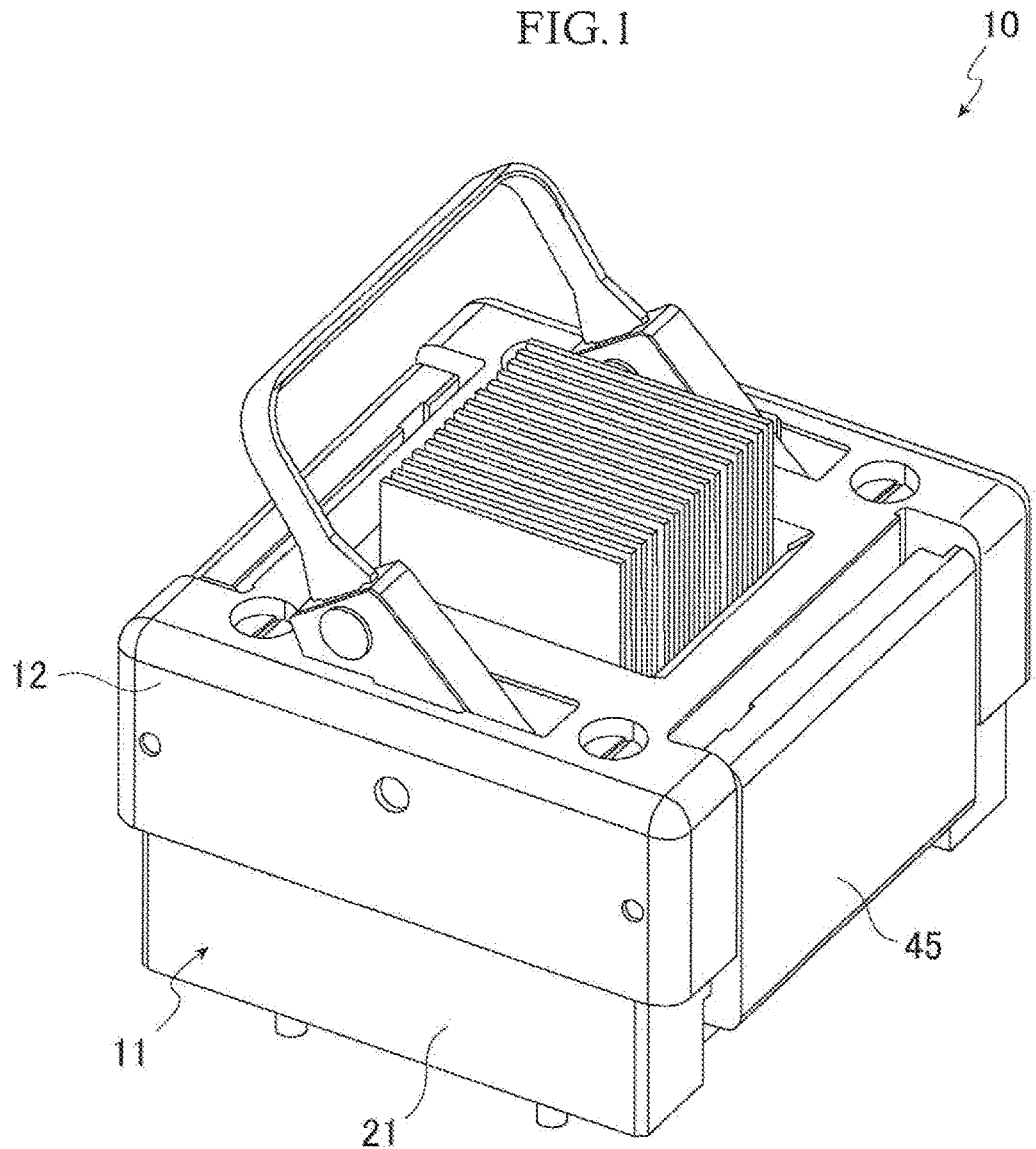
FIG. 1 is a perspective view showing the general configuration of a socket for electrical component in accordance with an embodiment 1 of the present invention.

As shown in FIG. 1 etc., an IC socket 10 as a "socket for electrical component" includes a socket body 11 and a cover member 12.

Figure 2:
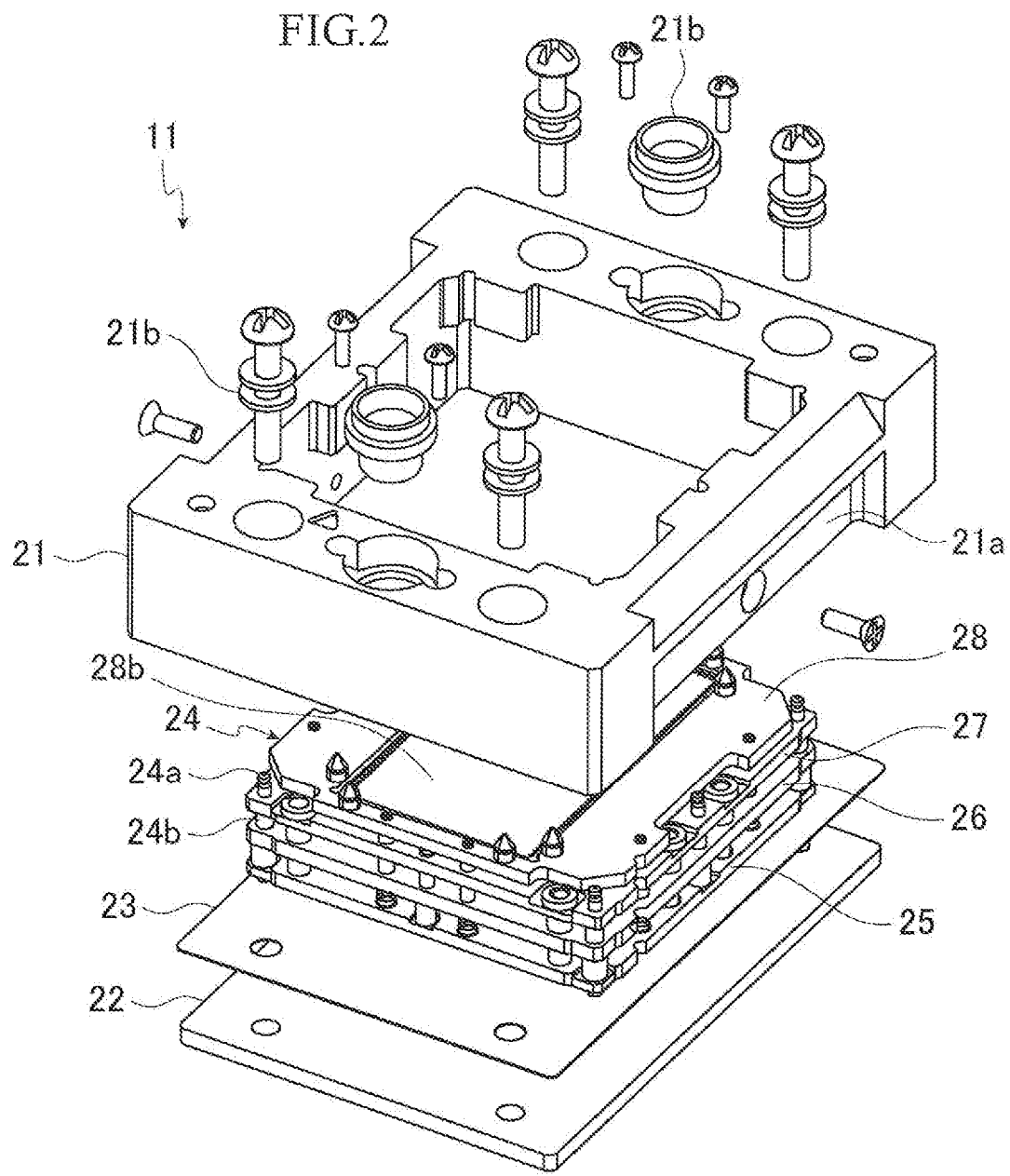
FIG. 2 is an exploded perspective view showing the configuration of a socket body of the socket for electrical component in accordance with the embodiment 1.

The socket body 11 includes, as shown in FIG. 2, a frame-shaped base part 21, a bottom plate 22 covering a bottom surface of this base part 21, an insulating plate 23 provided on an upper surface of this bottom plate 22, and a contact module 24 provided on this insulating plate 23 and housed in the base part 21.

On both left and right side surfaces of the base part 21, a pair of engaging concave portions 21a are formed to be engaged with engaging claws 45d, which are provided in bottom end portions of latches 45 described later, for fixing the socket body 11 and the cover member 12. In addition, in the vicinity of both front and back side surfaces of the base part 21, bushings 21b are provided for positioning the cover member 12 at the time of installation.

Figure 3:
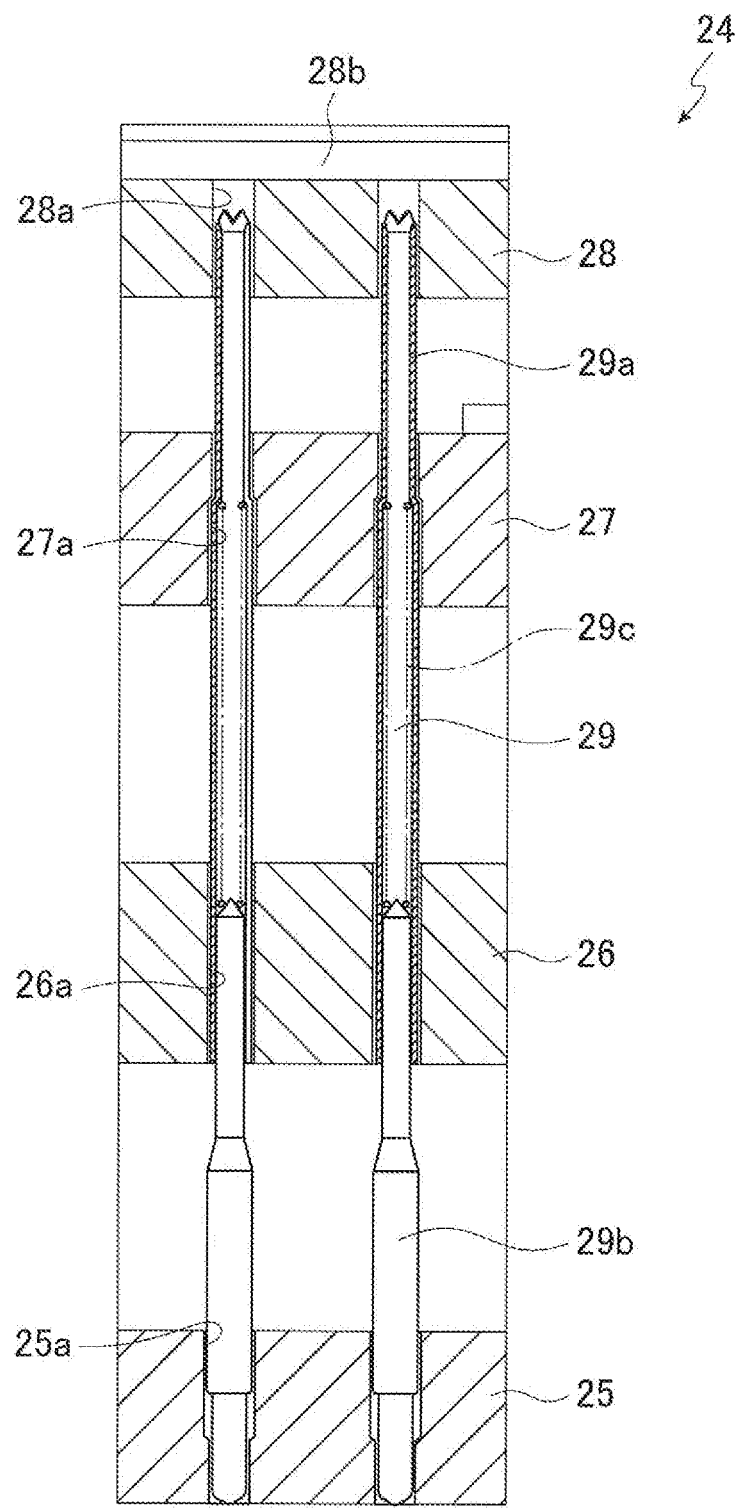
FIG. 3 is a cross-sectional view showing the configuration of a contact module of the socket for electrical component in accordance with the embodiment 1.

Additionally, in the contact module 24, as shown in FIGS. 2 and 3, a first plate 25, a second plate 26, a third plate 27 and a fourth plate (floating plate) 28 are arranged in this order from the bottom, and are fixed apart from each other by using screws 24a and spacers 24b.

Then, in each of these plates 25 to 28, respective through-holes 25a to 28a for housing contact pins 29 are formed.

In addition, a housing portion 28b for housing an IC package 13 (see FIG. 7 described later) as an "electrical component" is provided in an upper surface of the topmost fourth plate 28. When the IC package 13 is housed in the housing portion 28b, each electrode terminal provided on a bottom surface of the IC package 13 is inserted into the through-hole 28a, and contacts the contact pin 29.

The contact pin 29 includes, as shown in FIG. 3, a conductive stepped cylindrical upper plunger 29a, a conductive stepped round bar-like lower plunger 29b, and a coil spring 29c. Then, the upper plunger 29a is made to contact with a spherical terminal (not shown) of the IC package 13, and the lower plunger 29b is made to contact with a wiring substrate (not shown), and further, these upper plunger 29a and lower plunger 29b are biased in mutually separating directions by the coil spring 29c, thereby electrically connecting the IC package 13 to the wiring substrate.

On the other hand, the cover member 12 includes, as shown in FIGS. 1, 4, 5 and 6A to 6C, a frame-like cover body 41 that is placed on the base part 21 of the socket body 11 and includes an opening in a middle portion in the up and down directions. On both left and ride side surfaces of the cover body 41, there are provided latch attaching dents 41a for fitting thereto top end portions 45a of the latches 45 (described later), and on both sides of the latch attaching dent 41a, there are provided shaft holes 41b for inserting therein a latch shaft 45b of the latch 45. Further, the cover body 41 is provided with screw holes 41e for inserting therein screws 41c for holding an elevating part 43 (described later) via springs 41d. Additionally, on end portions of these latch attaching dents 41a, there are provided vertically elongated holes 41i (see FIGS. 6A to 6C) for inserting therein latch locking parts 43b (described later). In addition, on an upper surface side in the vicinity of both front and back side surfaces of the cover body 41, there are provided pressing part insertion holes 41f for inserting therein a pressing part 46 (described later), and camshaft holes 41g for rotatably supporting this pressing part 46 with camshafts 46g. Then, on a lower surface side in the vicinity of both front and back side surfaces of the cover body 41, there are provided guide pins 41h for positioning for setting the cover member 12 to the socket body 11.

Figure 4:
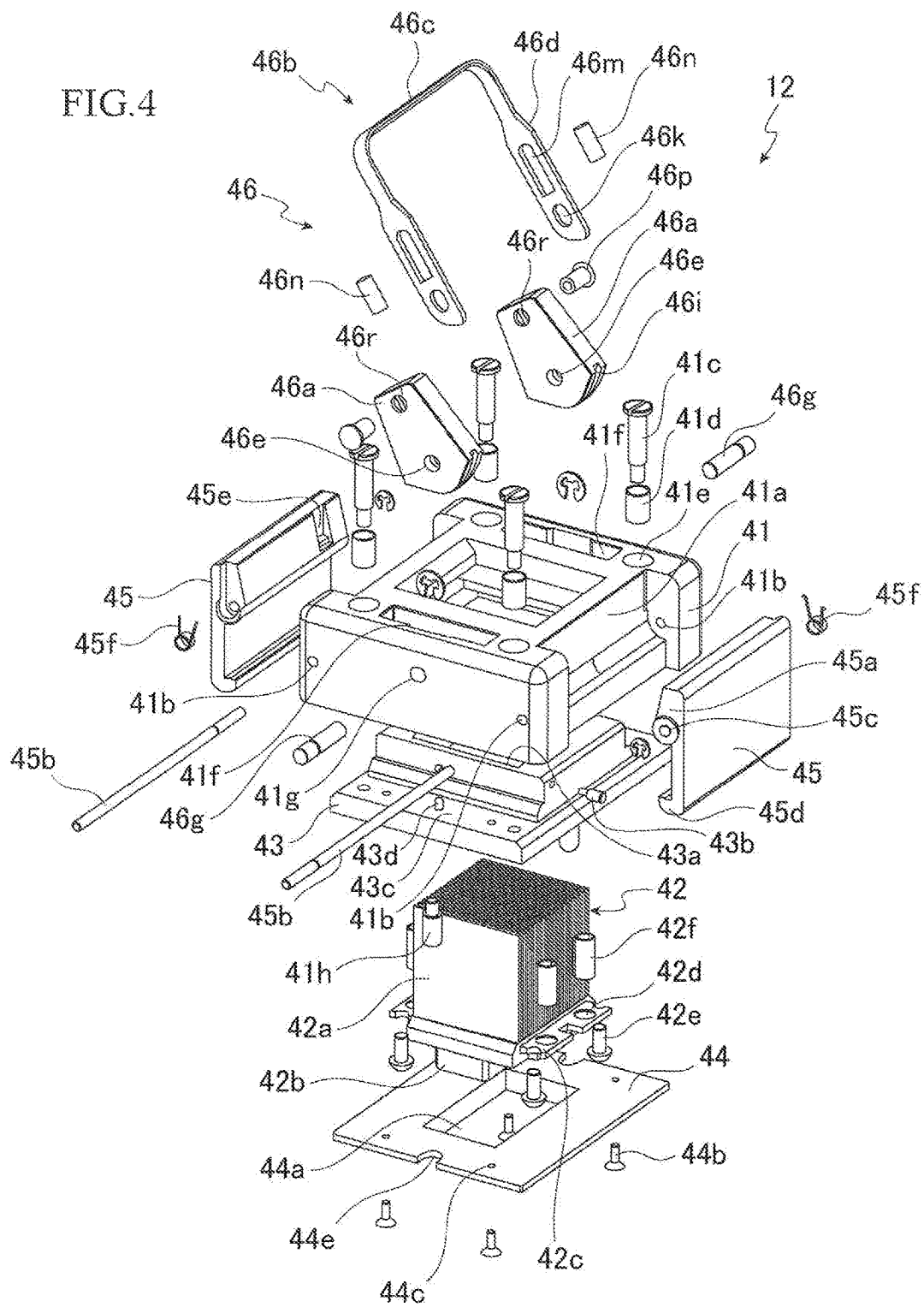
FIG. 4 is an exploded perspective view showing the configuration of a cover member of the socket for electrical component in accordance with the embodiment 1.

Additionally, the cover member 12 includes, as shown in FIG. 4, a heatsink 42 for fixing and performing heat dissipation for the IC package 13, the elevating part 43 for moving up and down the heatsink 42, and a back plate 44 for attaching the heatsink 42 to the elevating part 43.

On both left and right side surfaces of the heatsink 42, there are provided flange parts 42c extending toward an outer circumference direction, and each of the left and right flange parts 42c is provided with two recesses 42d. Springs 42f are fit into the recesses 42d. Additionally, screws 42e are screwed into screw holes (not shown) of the elevating part 43 via notches of the flange parts 42c, so as to fasten and fix the heatsink 42 to the elevating part 43.

The elevating part 43 is, as shown in FIG. 4, formed into a frame-like shape provided with an opening 43a in a middle portion in the up and down directions, and an upper portion 42a of the heatsink 42 is fit into this opening 43a. In addition, on both left and right side surfaces of the elevating part 43, there are provided the latch locking parts 43b (described later) by using, for example, a screw etc. Further, on a pressed surface 43c of the elevating part 43, there is provided cam locking parts 43d protruding therefrom for preventing the rotation of the pressing part 46 (described later) in the opposite direction.

Additionally, as shown in FIG. 4, the back plate 44 is also provided with an opening 44a in a middle portion in the up and down directions, and a lower portion 42b of the heatsink 42 is fit into this opening 44a. Further, the back plate 44 is provided with insertion holes 44c for inserting therein screws 44b, and notches 44e for positioning the back plate 44 by using the guide pins 41h.

Then, in a state where the lower portion 42b of the heatsink 42 is fit into the back plate 44, positioning is performed with the guide pins 41h, and fastening and fixing to a bottom surface of the elevating part 43 is performed by inserting the screws 44b into the insertion holes 44c from the down direction.

As shown in FIG. 4, the top end portions 45a of the latches 45 are fit into the latch attaching dents 41a of the cover body 41. A shaft hole 45c for inserting therein the latch shaft 45b is formed in the top portion 45a of the latch 45, such that the shaft hole 45c penetrates therethrough in the front-back direction. Then, by inserting the latch shaft 45b into the shaft hole 45c of the latch 45 and shaft holes 41b of the cover body 41, the latch 45 is rotatably supported by the cover body 41. Additionally, a latch spring 45f for biasing the latch 45 in a closing direction is attached to each of the latch attaching dents 41a.

Here, when the latches 45 are rotated in the closing direction, it is possible to fix the cover member 12 to the socket body 11 by engaging the engaging claws 45d provided to the bottom end portions of the latches 45 with the engaging concave portions 21a (see FIG. 2) of the socket body 11. On the other hand, when the latches 45 are rotated in an opening direction, it is possible to remove the cover member 12 from the socket body 11 by releasing the engagement between the engaging claws 45d and the engaging concave portions 21a.

Figure 6A:
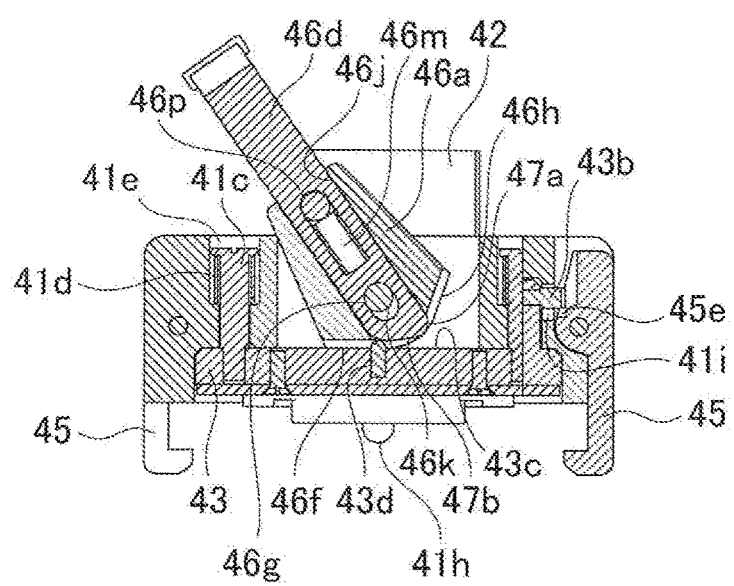
FIG. 6A is a cross-sectional view showing the configurations of an elevating mechanism and a latch mechanism of the socket for electrical component in accordance with the embodiment 1.

In addition, as shown in FIGS. 4 and 6A, on the top end portions 45a of the latches 45, there are provided locking concave portions 45e to be engaged with the latch locking parts 43b of the elevating part 43. As described later, when the elevating part 43 is moved down with the latches 45 closed, the latch locking parts 43b move down within the elongated holes 41i of the cover body 41 to be engaged with the locking concave portions 45e. Consequently, the rotation in the opening direction of the latches 45 is regulated, and locking is made in the closed state.

Additionally, as shown in FIG. 4, the pressing part 46 is attached to the cover body 41. As described later, by rotating this pressing part 46, it is possible to press and move down the elevating part 43 to be pressed against an upper surface of the IC package 13.

The pressing part 46 includes a pair of first cams 46a and a bail 46b. The bail 46b includes a horizontal bar portion 46c, and a pair of second cams 46d that are bent at right angle and extend in a rotation radial direction from both ends of the horizontal bar portion 46c. These first cams 46a, the second cams 46d, the horizontal bar portion 46c and the above-described cam locking parts 43d constitute an "elevating mechanism" of the present invention.

The first cams 46a are, as shown in FIG. 6A, provided with insertion slits 46j for inserting therein the bail 46b from the top end side. In addition, these first cams 46a are provided with shaft holes 46e and rivet holes 46r arranged along the rotation radial direction. Additionally, the bottom end portions of these first cams 46a are provided with, as shown in FIG. 6A, first cam surfaces 46f to be abut against the pressed surface 43c of the elevating part 43 in a state where the elevating part 43 is moved up, and second cam surfaces 46h to be abut against the elevating part 43 in a state where the elevating part 43 is moved down. Further, the first cam surfaces 46f and the second cam surfaces 46h of these first cams 46a are provided with, as shown in FIG. 4, grooves 46i along a rotation direction. When the first cams 46a are rotated, the cam locking parts 43d of the elevating part 43 pass through the inside of the grooves 46i.

The second cams 46d of the bail 46b include short elongated holes 46k and long elongated holes 46m arranged along the rotation radial direction. As shown in FIG. 6A, in the tips of the second cams 46d, lock portions 47a having a steep angle and gentle-angled portions 47b having a gentle angle are continuously formed via curved surfaces. In this manner, when the tips of the second cams 46d abut against the elevating part 43 to move down the elevating part 43, the tips of the second cams 46*d* are not locked by the cam locking parts 43*d*, and the gentle-angled portions 47*b* move on the pressed surface 43*c*. However, when an attempt is made to rotate the tips of the second cams 46*d* in the opposite direction, the lock portions 47*a* are locked by the cam locking parts 43*d*, and thus it is possible to prevent the rotation.

When assembling the pressing part 46, first, bail springs 46*n* are fit into the long elongated holes 46*m*. On this occasion, the bail springs 46*n* are fit so as to abut against tip-side end portions of the long elongated holes 46*m*. Then, after inserting the second cams 46*d* into the insertion slits 46*j* of the first cams 46*a*, rivets 46*p* are inserted into the rivet holes 46*r* of the first cams 46*a* and the long elongated holes 46*m* of the second cams 46*d*. In this manner, the first cams 46*a* are mounted to the bail 46*b*.

Next, the first cams 46*a* are inserted into the pressing part insertion holes 41*f* of the cover body 41, the camshafts 46*g* are put in from the camshaft holes 41*g* on both front and back side surfaces of this cover body 41 to be inserted into the shaft holes 46*e* of the first cams 46*a* and the short elongated holes 46*k* of the second cams 46*d*. In this manner, the first cams 46*a* and the second cams 46*d* are rotatably supported by the cover body 41, and it is possible to pull the second cams 46*d* in the rotation radial direction against the biasing force of the bail springs 46*n*.

Subsequently, a description is given of a usage method of the IC socket 10 in accordance with this embodiment 1.

Figure 7A:
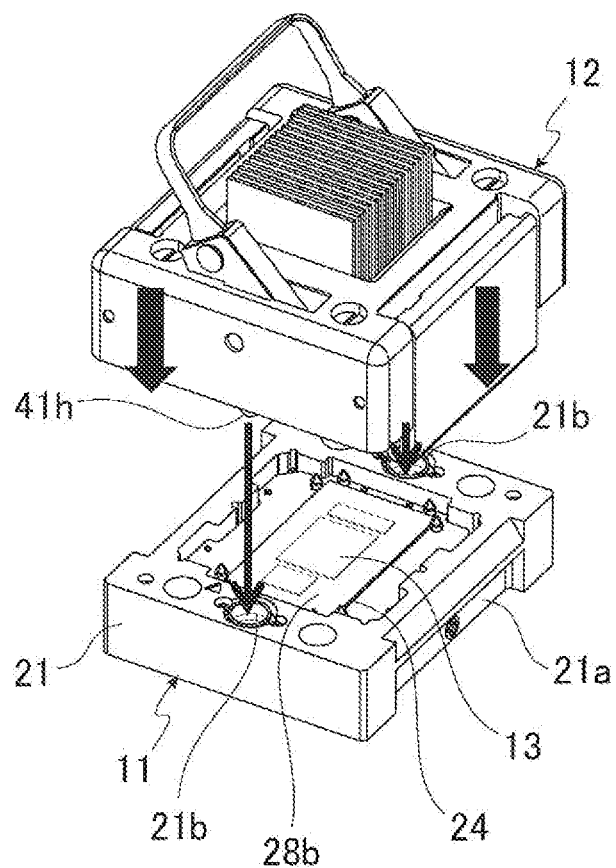
FIG. 7A is a perspective view for explaining a usage method of the socket for electrical component in accordance with the embodiment 1.

First, as shown in FIG. 7A etc., the IC package 13 is housed in the housing portion 28*b* provided in the contact module 24 of the socket body 11.

Then, the cover member 12 is installed on this socket body 11. On this occasion, by inserting the guide pins 41*h* of the cover member into the bushings 21*b* of the base part 21, the socket body 11 is positioned with the cover member 12.

Figure 7B:
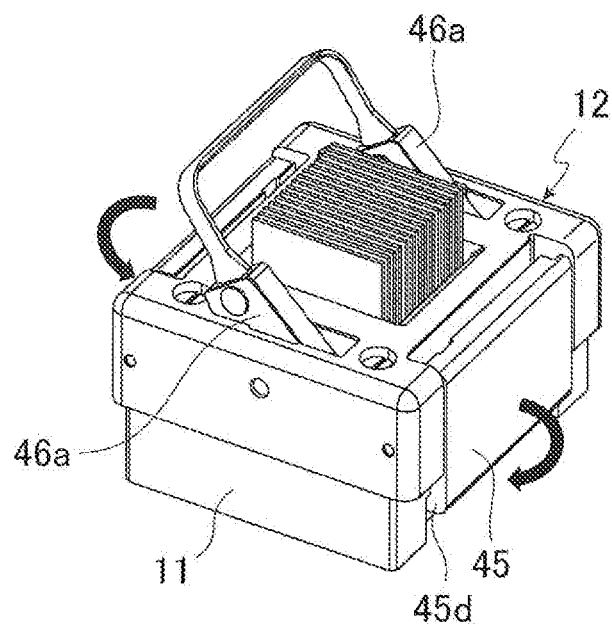
FIG. 7B is a perspective view for explaining the usage method of the socket for electrical component in accordance with the embodiment 1.

Further, as shown in FIG. 7B, the engaging claws 45*d* of the latches 45 provided to the cover member 12 are engaged with the engaging concave portions 21*a* (see FIG. 7A etc.) provided to the base part 21 of the socket body 11. On this occasion, the first cams 46*a* of the pressing part 46 abut against the pressed surface 43*c* of the elevating part 43 at the first cam surface 46*f* (see FIG. 6A). Additionally, on this occasion, as shown in FIG. 6A, the elevating part 43 is at the highest position due to the biasing force of the springs 41*d*. Thus, a bottom surface of the heatsink 42 is not pressed against the upper surface of the IC package 13.

Figure 6B:
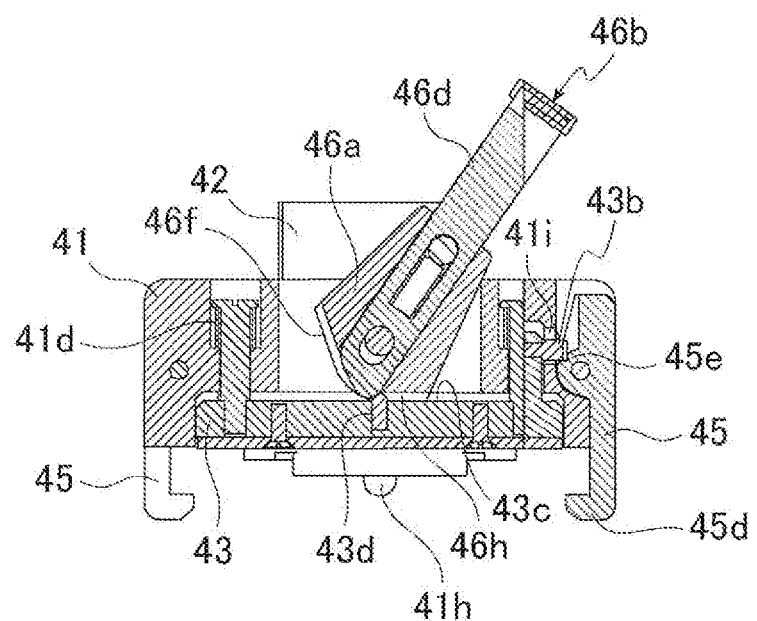
FIG. 6B is a cross-sectional view showing the configurations of the elevating mechanism and the latch mechanism of the socket for electrical component in accordance with the embodiment 1.
Figure 6C:
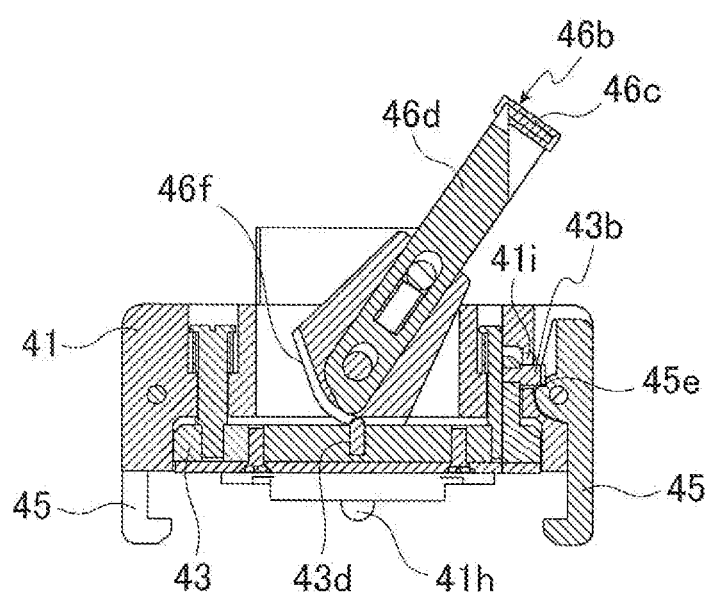
FIG. 6C is a cross-sectional view showing the configurations of the elevating mechanism and the latch mechanism of the socket for electrical component in accordance with the embodiment 1.
Figure 7C:
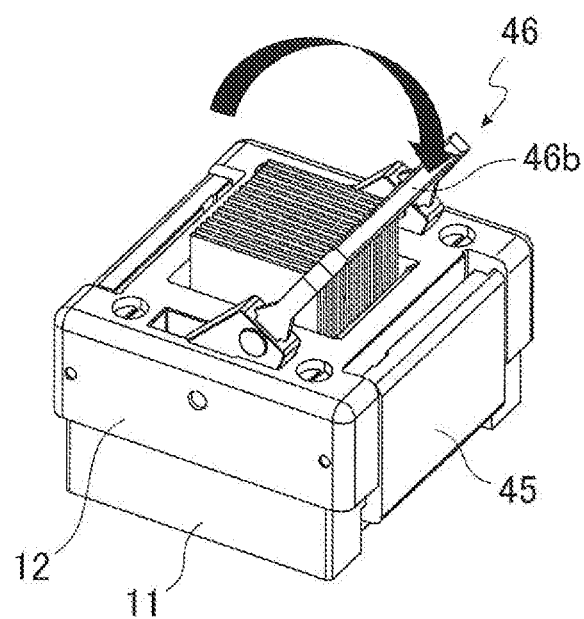
FIG. 7C is a perspective view for explaining the usage method of the socket for electrical component in accordance with the embodiment 1.

Thereafter, as shown in FIG. 7C, the bail 46*b* of the pressing part 46 is rotated from the left side to the right side in FIG. 7C. As described above, the shapes of the tips of the second cams 46*d* are formed such that the tips of the second cams 46*d* move on the pressed surface 43*c* without being locked by the cam locking parts 43*d*. Therefore, as shown in FIG. 6B, the second cams 46*d* can be rotated in accordance with the rotation of the bail 46*b*. In this manner, the first cams 46*a* are rotated in accordance with the rotation of the second cams 46*d*, and press the pressed surface 43*c* of the elevating part 43 in the down direction. Consequently, the elevating part 43 is moved down against the biasing force of the springs 41*d*, and the bottom surface of the heatsink 42 is pressed against the upper surface of the IC package 13. In this manner, the IC package 13 is fixed to the housing portion 28*b*. As described above, in this embodiment, the elevating part 43 is biased upwardly by the springs 41*d* provided in the cover body 41 (see FIG. 4, FIGS. 6A to 6C), and further, the heatsink 42 is biased downwardly by the springs 42*f* provided in the elevating part 43 (see FIG. 4, FIG. 5). Thus, it is possible to appropriately set the pressing force of the heatsink 42 with respect to the IC package 13.

Then, when the bail 46*b* is rotated to a predetermined position, the second cams 46*d* climb over the cam locking parts 43*d*, and the second cam surfaces 46*h* of the first cams 46*a* abut against the pressed surface 43*c* of the elevating part 43.

Additionally, on this occasion, since the elevating part 43 is moved down, the latch locking parts 43*b* descend within the elongated holes 41*i* of the cover body 41 to be engaged with the locking concave portions 45*e* of the latches 45. In this manner, the latches 45 are prevented from being rotated in the opening direction, and consequently, the cover member 12 cannot be removed from the socket body 11.

As described above, the shapes of the tips of the second cams 46*d* are formed such that the tips of the second cams 46*d* are engaged with the cam locking parts 43*d*, and the rotation in the opposite direction cannot be made. Thus, once the second cams 46*d* climb over the cam locking parts 43*d*, the first cams 46*a* also cannot be rotated in the opposite direction. Thus, IC socket 10 is locked in a state where the heatsink 42 is pressed against the IC package 13, and the engaging claws 45*d* of the latches 45 are engaged with the engaging concave portions 21*a* of the socket body 11.

On the other hand, when unlocking this lock, first, as shown in FIG. 6C, the horizontal bar portion 46*c* of the bail 46*b* is pulled up in a direction away from the elevating part 43. In this manner, because the tips of the second cams 46*d* are moved to be above the cam locking parts 43*d*, it is possible to rotate the second cams 46*d* in the opposite direction, that is, the left direction in FIG. 6C. Then, when the bail 46*b* is rotated in the opposite direction, and the tips of the second cams 46*d* climb over the cam locking parts 43*d*, the elevating part 43 is moved up to the highest position due to the biasing force of the springs 41*d*. In this manner, the heatsink 42 is moved up and separated from the IC package 13, and the engagement between the locking concave portions 45*e* of the latches 45 and the latch locking parts 43*b* of the elevating part 43 is released. Consequently, it is possible to remove the cover member 12 from the socket body 11 by releasing the engagement between the engaging claws 45*d* and the engaging concave portions 21*a* of the socket body 11.

As explained above, according to the embodiment 1, it is possible to prevent the rotation in the opposite direction by engaging the second cams 46*d* with the cam locking parts 43*d*, and it is possible to release the locked state by moving the second cams 46*d* in the radial direction. Accordingly, it is possible to easily switch the elevating part 43 between the moved-up state and the moved-down state.

Additionally, according to the embodiment 1, because it is possible to move down the elevating part 43 by rotating the first cams 46*a* and the second cams 46*d*, the operation is easy.

Additionally, according to the embodiment 1, because it is possible to move down the elevating part 43 by operating the horizontal bar portion 46*c* of the pressing part 46, the operation is easy.

Additionally, according to the embodiment 1, it is possible to realize, with a simple configuration, a mechanism for releasing the locked state by pulling up the second cams 46*d* in the direction away from the elevating part 43.

Additionally, according to the embodiment 1, because the grooves 46*i* are provided in the first cam surfaces 46*f* and the second cam surfaces 46*h* of the first cams 46*a*, and the first cams 46*a* are rotated such that the cam locking parts 43*d* of the elevating part 43 pass through the inside of the grooves 46i, it is possible to stabilize the rotation operation of the first cams 46a.

Additionally, according to the embodiment 1, the configuration is employed where, while the gentle-angled portions 47b are not locked by the cam locking parts 43d when the gentle-angled portions 47b are moved on the pressed surface 43c of the elevating part 43, the lock portions 47A are locked by the cam locking parts 43d when the lock portions 47A are moved on the pressed surface 43c. Accordingly, it is possible to inhibit, with a simple configuration, the rotation in the opposite direction, while allowing the rotation in the forward direction of the second cams 46d.

Additionally, according to the embodiment 1, by providing the insertion slits 46j to the first cams 46a and inserting therein the second cams 46d, and exposing the tips of the second cams 46d from the insertion slits 46j, it is possible, with a simple configuration, to rotate the second cams 46d and to move the second cams 46d in the radial direction of the rotation while supporting the second cams 46d by the first cams 46a.

REFERENCE SIGNS LIST

10 IC socket
11 socket body
12 cover member
13 IC package
21 base part
21a engaging concave portion
22 bottom plate
23 insulating plate
24 contact module
41 cover body
42 heatsink
43 elevating part
43b latch locking part
43d cam locking part
44 back plate
45 latch
45e locking concave portion
46 pressing part
46a first cam
46b bail
46c horizontal bar portion
46d second cam
46k short elongated hole
46m long elongated hole
46n bail spring

The invention claimed is:

1. An elevating mechanism comprising: an elevating part supported by a body part such that the elevating part can be moved up and down; and a pressing part supported by the body part and moving down the elevating part,
wherein the pressing part includes a first cam rotatably supported by the body part, and a second cam supported by the first cam and capable of being rotated and moved in a radial direction of the rotation,
the elevating part includes a cam locking part provided on a rotational orbit of the second cam,
a shape of a tip of the second cam is formed such that the tip of the second cam passes over the cam locking part when the elevating part is moved down by making the tip of the second cam abut against the elevating part and rotate, and the tip of the second cam is locked by the cam locking part so as to prevent the rotation when an attempt is made to perform the rotation in the opposite direction, and
the rotation in the opposite direction is enabled by moving the second cam in the radial direction of the rotation with respect to the first cam, so as to release a locked state between the second cam and the cam locking part.

2. The elevating mechanism according to claim 1,
wherein a first cam surface and a second cam surface, which are angled to each other, are formed in a tip of the first cam,
in a state where the elevating part is moved up, an upper surface of the elevating part abuts against the first cam surface, and
the elevating part is moved down by rotating the first cam such that the second cam surface abuts against the upper surface of the elevating part.

3. The elevating mechanism according to claim 1, wherein the pressing part is provided in each of a pair of opposing sides of the body part, and the second cams of these pair of pressing parts are connected to each other with a horizontal bar portion.

4. The elevating mechanism according to claim 1,
wherein the second cam includes a first elongated hole and a second elongated hole provided along the radial direction of the rotation,
the first cam is provided with protruding portions inserted in the respective first and second elongated holes, the number of the protruding portions being the same as the number of the elongated holes, and
the second cam is biased in a direction approaching to the elevating part by providing a biasing member between an end portion of any of the elongated holes and the protruding portion inserted in the elongated hole.

5. The elevating mechanism according to claim 1,
wherein, in the tip of the second cam, a lock portion having a steep angle and a gentle-angled portion having a gentle angle are continuously formed via a curved surface, and
when the elevating part is moved down, the gentle-angled portion climbs over the cam locking part and moves on a pressed surface of the elevating part without being locked by the cam locking part, and when an attempt is made to rotate the second cam in the opposite direction after the gentle-angled portion climbed over the cam locking part, the lock portion is locked by the cam locking part to prevent the rotation.

6. The elevating mechanism according to claim 1,
the tip of the first cam includes a groove formed along a rotating direction of the first cam, and the first cam is rotated such that the cam locking part passes through an inside of the groove.

7. The elevating mechanism according to claim 1,
the first cam includes an insertion slit, the second cam is inserted into the insertion slit, and the tip of the second cam is exposed from the insertion slit.

8. A socket for electrical component, comprising: a socket body in which an electrical component is housed in a housing portion provided in an upper surface side, and a contact pin to be electrically connected to the electrical component is provided; and a cover member removably provided to the socket body and covering the housing portion of the socket body,
wherein the cover member includes a cover body placed on the socket body, and
the elevating mechanism according to claim 1 is provided to the cover body.

* * * * *